United States Patent [19]

Choi

[11] Patent Number: 5,270,588

[45] Date of Patent: Dec. 14, 1993

[54] DATA OUTPUT BUFFER WITH SELECTIVE BOOTSTRAP CIRCUIT

[75] Inventor: Yun-ho Choi, Incheon, Rep. of Korea

[73] Assignee: Samsung Elecronics, Kyunggi, Rep. of Korea

[21] Appl. No.: 813,451

[22] Filed: Dec. 26, 1991

[51] Int. Cl.$^5$ .................. H03K 19/092; H03K 19/02
[52] U.S. Cl. ..................... 307/475; 307/482; 307/296.8; 307/443; 307/473
[58] Field of Search ........... 307/475, 482, 473, 296.8, 307/443, 270

[56] References Cited

U.S. PATENT DOCUMENTS

| | | | |
|---|---|---|---|
| 4,049,979 | 9/1977 | Shieu et al. | 307/482 |
| 4,484,092 | 11/1984 | Campbell, Jr. | 307/482 |
| 5,065,049 | 11/1991 | Jang | 307/482 |
| 5,128,563 | 7/1992 | Hush et al. | 307/482 |

*Primary Examiner*—Edward P. Westin
*Assistant Examiner*—Richard Roseen
*Attorney, Agent, or Firm*—Cushman, Darby & Cushman

[57] ABSTRACT

A data output buffer includes an output driving stage having a pair of parallel pull-up transistors and a pull-down transistor, a latch circuit for latching a pair of complementary signals, a second gate for gating the non-inverted output signal of the latch circuit in response to an external output enable signal and then supplying it to the gate of one pull-up transistor of the output driving state, a third gate also for gating the non-inverted output signal of the latch circuit in response to an external output enable signal, and a selective bootstrap circuit for driving the other pull-up transistor of the output driving stage. The output driving stage is driven to an external supply voltage when the external supply voltage is higher than a set voltage, and is driven to a boosted voltage when the external supply voltage is lower than the set voltage, determined by output signals from the second and third gates.

7 Claims, 6 Drawing Sheets

0V < DB < Vcc + α

0V < DB < Vcc

0V < DB < Vcc

# DATA OUTPUT BUFFER WITH SELECTIVE BOOTSTRAP CIRCUIT

CROSS-REFERENCES TO RELATED APPLICATIONS

This application is related to currently co-pending U.S. patent application Ser. 07/767,616 filed on Sep. 30, 1991.

BACKGROUND OF THE INVENTION

1. Field of the Invention

The present invention relates to a data output buffer and more particularly to a new data output buffer having a selective bootstrap circuit in accordance with the supply voltage level.

2. Description of the Prior Art

Recently, along with the development of miniaturizing techniques in the semiconductor field, memory devices, VLSI circuitry and so forth, become large scale and ultra-integrated, lowering the supply voltage. As the supply voltage becomes low, the noise margin narrows accordingly, requiring a counter-approach to noise in accordance with the variation in supply voltage.

Concerning MOS techniques, the loss of static power is a serious question. To counteract this problem, the output stage of a data output buffer is constructed as a push-pull type, in which the pull-up device is supplied with a data signal DB and the pull-down device supplied with an inverted data signal $\overline{DB}$.

Referring to FIG. 1, a conventional data output buffer provides a way for supplying a signal DB at a supply voltage level Vcc to the gate of an NMOS pull-up transistor Ml to drive the output high. However, this design has the disadvantage of providing a weak VOH (the high state of output data) for a low supply voltage Vcc, and is slow in operation. A complementary data output buffer as shown in FIG. 2 provides a way to solve these problems using a PMOS pull-up transistor M3, which improves the VOH and speed when compared with the conventional data output buffer of FIG. 1, but provides poor latch up characteristics during operation. To overcome this deficiency, a bootstrapping data output buffer, as shown in FIGURE 3, for driving an NMOS pull-up transistor M5 high with a boosted voltage level (voltage above Vcc) has been suggested. However, during high supply voltages, the latter suffers from increasing noise.

SUMMARY OF THE INVENTION

It is an objective of the present invention to provide a new data output buffer which drives a logic high to both a boosted voltage level when supply voltage is low, and to the supply voltage for high supply voltage conditions.

It is another objective of the present invention to provide a new data output buffer which reduces noise in logic low data output.

It is yet another objective of the present invention to provide a new data output buffer whose noise characteristic is improved regardless of the level of the supply voltage.

To achieve these objectives, the present invention comprises:

an output driving stage having a pair of pull-up transistors connected in parallel to each other and a pull-down transistor;

a latch circuit for latching a pair of complementary signals;

first gate means for gating an inverted output signal of the latch circuit in response to an external output enable signal. A first inverter is provided to invert the output of the first gate means and to supply the inverted output to the gate of the pull-down transistor of the output driving stage.

A second gate means and a third gate means are used to gate a non-inverted output signal of the latch circuit and in response to the external output enable signal.

A selective bootstrap circuit, responsive to an external supply voltage, a gated non-inverted output signal from the second gate means, and an output from the third gate means, is used to drive the gate of the other transistor of the pull-up transistor pair to a voltage level of the external supply voltage when the external supply voltage is higher than a predetermined voltage level; and to a boosted voltage level when the external supply voltage is lower than the predetermined voltage level.

The first inverter is constituted by a CMOS inverter having a pull-up load, so that the current derivative di/dt of the pull-down transistor of the output driving stage is inhibited to reduce noise.

The selective bootstrap circuit according to the present invention includes a constant voltage generator for supplying a constant voltage regardless of the supply voltage, a comparator for comparing the constant voltage with the supply voltage, and a selective bootstrap load for driving a pull-up transistor by a boosted voltage at low supply voltages and by the supply voltage when the supply voltage is high. The selective bootstrap circuit operates in response to an output signal of the comparator thereby preventing power source line noise due to supply voltage variations.

BRIEF DESCRIPTION OF THE DRAWINGS

The above objectives and advantages of the present invention will become more apparent by describing the preferred embodiment of the present invention with reference to the following drawings.

DETAILED DESCRIPTION OF THE PREFERRED EMBODIMENTS

Figure 3:
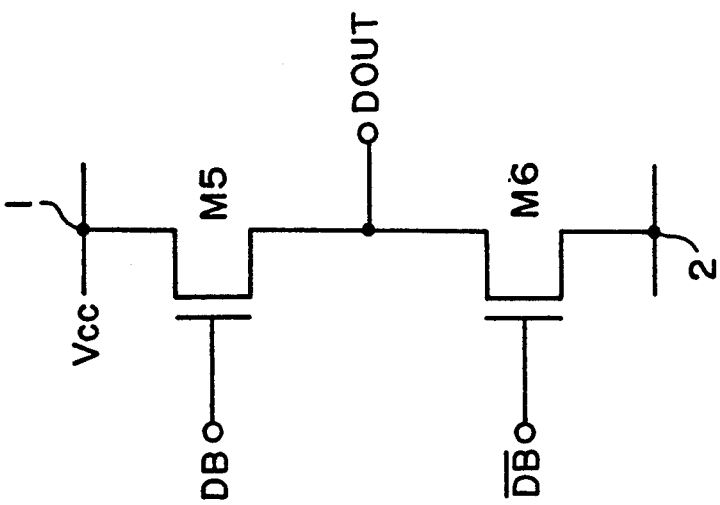
FIG. 3 shows an NMOS output driving stage of a conventional bootstrapping-type data output buffer.
Figure 2:
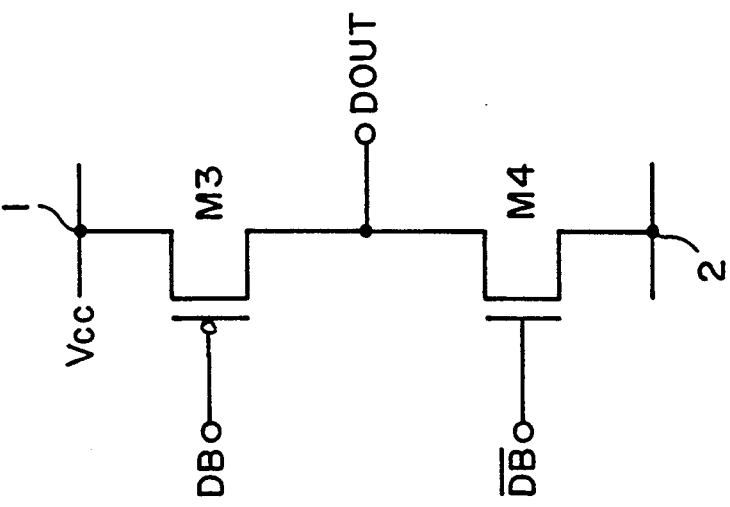
FIG. 2 shows a complementary-type output driving stage of a second type conventional data output buffer.
Figure 1:
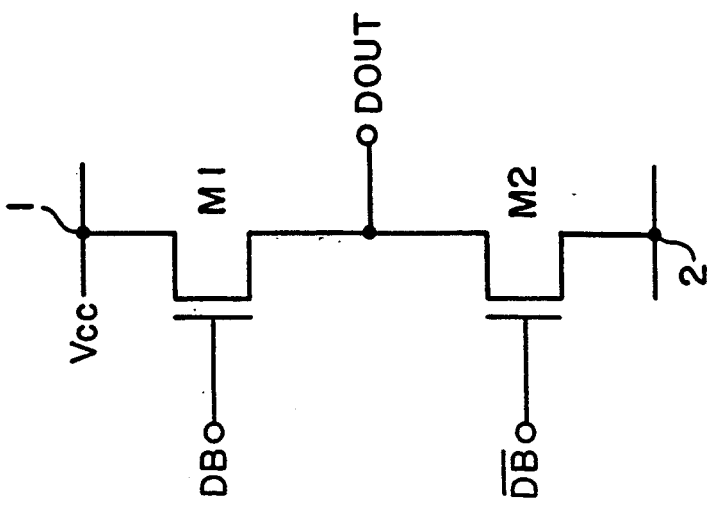
FIG. 1 shows an NMOS output driving stage of a first type conventional data output buffer.
Figure 4:
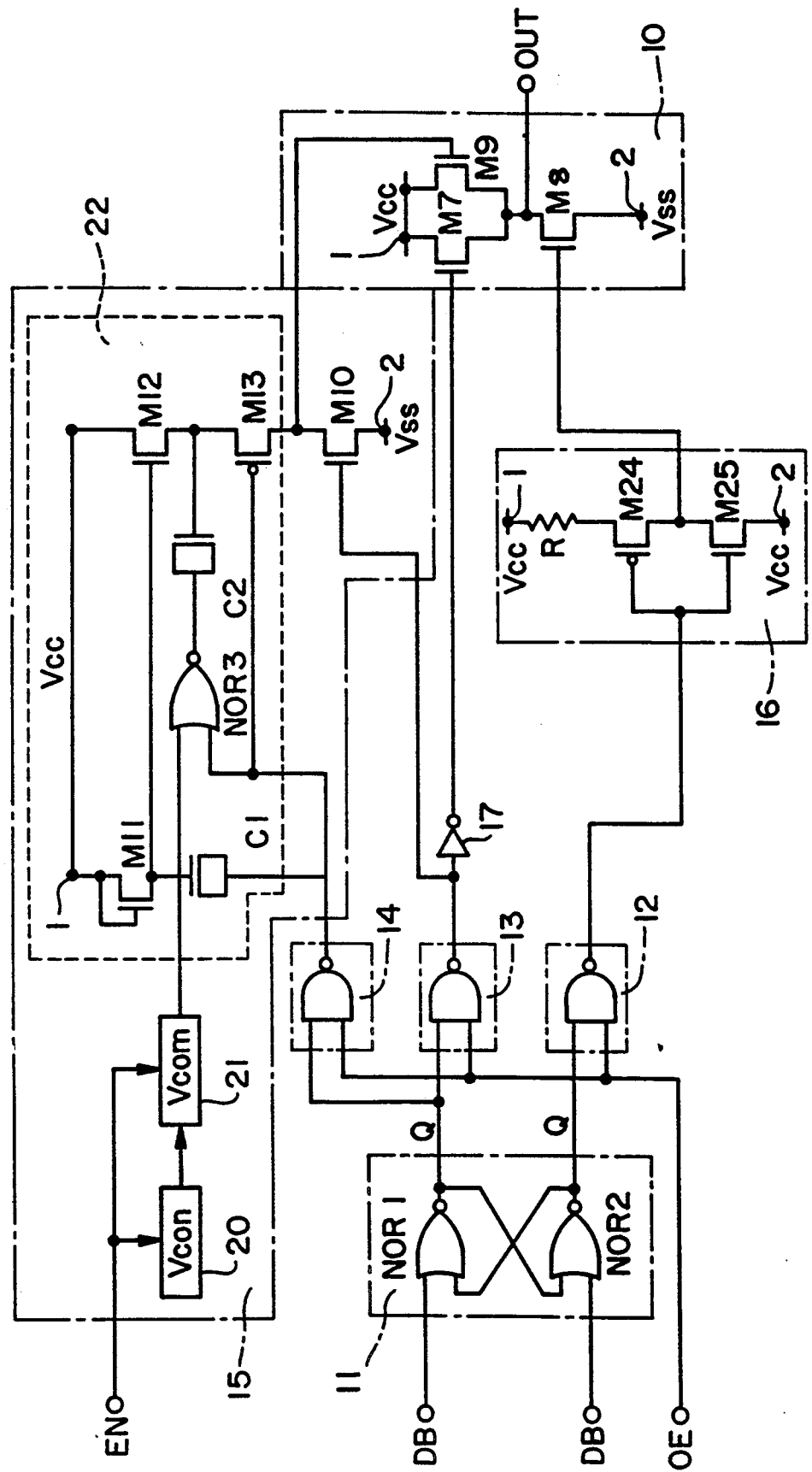
FIG. 4 is a circuit diagram of a data output buffer according to the present invention.

Referring to FIG. 4, the data output buffer of the present invention comprises output driving stage 10, latch circuit 11, first through third NAND gates 12, 13, and 14, inverter 17, and selective bootstrap circuit 15.

Output driving stage 10 consists of a pair of NMOS pull-up transistors M7 and M9 connected in parallel between a first power source line 1 and a data output terminal DOUT, an NMOS pull-down transistor M8 connected between the data output terminal DOUT and a second power source line 2.

The latch circuit 11 is of an RS latch constitution whose set and reset inputs are a pair of complementary data signals $\overline{DB}$ and DB, and consists of a pair of NOR gates NOR1 and NOR2 in which outputs are cross-connected to one input of the other. The outputs of latch circuit 11 are supplied to one or more gate circuits 12, 13, and 14, i.e., NAND gates 12, 13, and 14, each having a first input externally supplied by an output enable signal OE.

The inverted output $\overline{Q}$ from latch circuit 11 is supplied to a second input of NAND gate 12 whose output is coupled to output driving stage 10 through first inverter 16 which includes CMOS transistors M24 and M25 and pull-up load R.

When $\overline{DB}$ becomes Vss level, driving the data low, the output level of first NAND gate 12 also becomes Vss and turns on PMOS transistor M24. At such time, the current derivative di/dt of NMOS pull-down transistor M8 of output driving stage 10 is inhibited by slowly pulling the voltage supplied to the gate of NMOS pull-down transistor M8 up to the Vcc level, through pull-up load R. Thus, logic low noise resulting from undershoot occurring at the falling edge of the output data is reduced.

The second input to each of NAND gates 13 and 14 is supplied with non-inverted output Q from latch circuit 11. The output of NAND gate 13 is connected to output driving stage 10 via second inverter 17, while the output of NAND gate 14 is supplied to selective bootstrap circuit 15.

Selective bootstrap circuit 15 comprises constant voltage generator 20, comparator 21, selective bootstrap load 22 and drive transistor M10. Constant voltage generator 20 always supplies a constant voltage Vcon to comparator 21 regardless of variations in the supply voltage Vcc. Comparator 21 compares constant voltage Vcon with the supply voltage Vcc outputting a high logic signal in response to a high supply voltage Vcc and a low logic signal in response to a low Vcc. For output data to be driven high, the selective bootstrap load 22 combines the output signals of comparator 21 and third NAND gate 14, to be selectively bootstrapped according to the supply voltage Vcc. Thus, under weak Vcc conditions, the output provided by selective bootstrap load 22 is equal to the bootstrapped supply voltage (boosted Vcc), and for strong Vcc signals, the output is Vcc. Drive transistor M10 is a source grounded NMOS transistor whose gate is driven by the output from second NAND gate 13. Selective bootstrap load 22 is connected between the drain of drive transistor M10 and first power source line 1.

Accordingly, for output data to be driven low, the drive transistor M10 is turned on, pulling the output of selective bootstrap circuit 15 low. While the output data is high, because the drive transistor M10 is turned off, the voltage provided by selective bootstrap load 22 becomes the output of selective bootstrap circuit 15, and supplied to the gate of pull-up transistor M9 of output driving stage 10. Thus, pull-up transistor M9 is sufficiently driven by a high voltage above Vcc at a low Vcc and by the voltage Vcc at a high Vcc.

Accordingly, for logic high data, a pair of pull-up transistors M7 and M9 of output driving stage 10 are turned on to sufficiently increase the level of data output DOUT to the supply voltage Vcc. At this time, when the supply voltage Vcc is supplied as a high Vcc, the pull-up transistor M9 is driven to a Vcc, thereby preventing overdriving.

The selective bootstrap load 22 consists of NMOS load transistor M12 connected between the first power source line 1 and the drain terminal of drive transistor M10, first MOS capacitor C1 connected between the gate of load transistor M12 and the output of third gate 14, NMOS biasing transistor M11 for precharging first MOS capacitor C1 to a voltage level $V_{cc}$-$V_T$, a fourth gate (NOR gate NOR3) for combining the outputs of third gate 14 and comparator 21 to select bootstrapping, second MOS capacitor C2 connected between the output of NOR gate NOR3 and the source of load transistor M12, and PMOS switching transistor M13 connected between load transistor M12 and drive transistor M10 which is switched according to the output state of third gate 14.

The initial state of selective bootstrap load 22 is when first capacitor C1 is charged to the voltage level $V_{cc}$-$V_T$, where $V_T$ is the threshold voltage of NMOS transistor M11, and the second capacitor C2 is charged to the level Vcc-$2V_T$, where $2V_T$ are the thresholds of M11 and M12. As the output of third NAND gate 14 goes high, the gate of load transistor M12 is supplied with a voltage boosted to approximately Vcc+$2V_T$. Accordingly, the drain of load transistor M12 is supplied with the voltage of approximately Vcc. Because the output of NOR gate NOR3 is high when Vcc is somewhat low, the voltage at the drain of load transistor M12 is boosted to approximately Vcc+$V_T$, beyond the initially charged voltage of second capacitor C2.

Figure 5A:
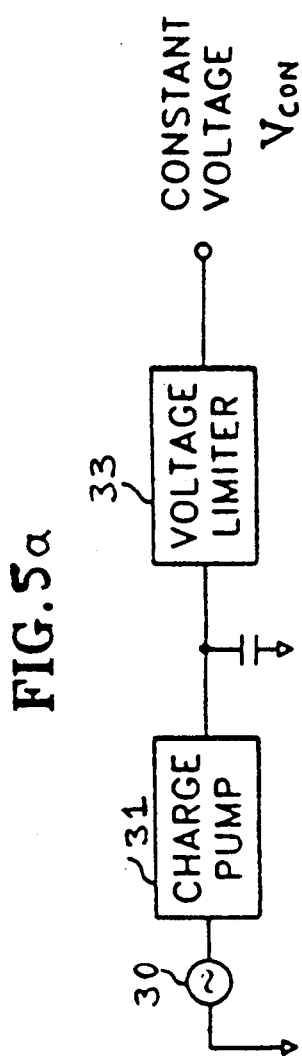
FIGS. 5a–5d are circuit diagrams of a constant voltage generator shown in FIG. 4.

Referring to FIG. 5a, constant voltage generator 20 of the present invention comprises an oscillator 30 for generating an alternating current, a charge pump 31 for pumping the charge from the first power source line at a predetermined pump rate in response to the alternating current signal, a charging capacitor 32 for storing electric charges pumped by charge pump 31, and a voltage limiter 33 for limiting the voltage across the capacitor 32 to a predetermined level and outputting a constant voltage. The constant voltage generator 20 always generates a constant voltage Vcon regardless of variations in supply voltage Vcc.

Figure 5B:
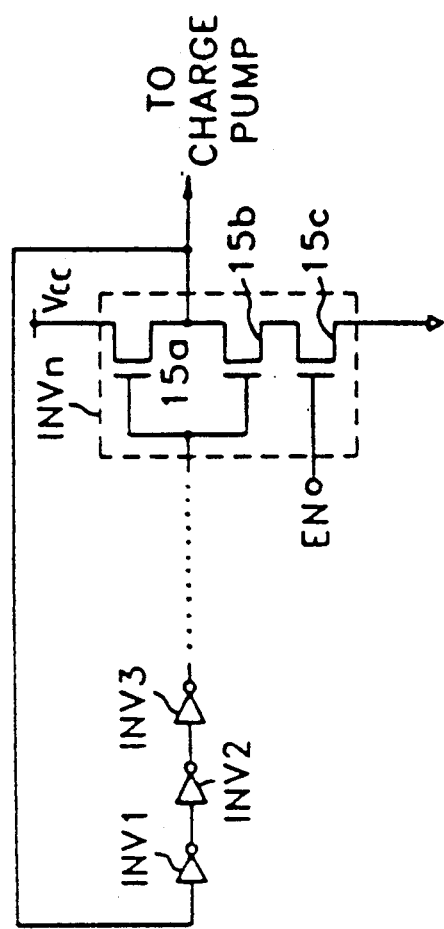

Referring to FIG. 5b, oscillator 30 is a ring oscillator in which the output of n cascaded CMOS inverters INV1–INVn is fedback to the input of first inverter INV1. The last inverter INVn is provided such that the oscillator is enabled by a system enable signal EN. In this inverter construction wherein PMOS and NMOS transistors 15a and 15b are connected in series between the supply voltage and ground, the source of the NMOS transistor 15b is grounded through another enabling transistor. The gate of NMOS transistor 15c is fed with the enable signal En, to be turned on during a high logic input. The approximate frequency of the ring oscillator is given by $(2Tdn)^{-1}$, where Td is the time delay of one CMOS inverter and n is the number of inverters. Although a ring oscillator 30 is herein given as an example, any kind of oscillator may serve as oscillator 30 provided it can be installed on a VLSI chip.

Figure 5C:
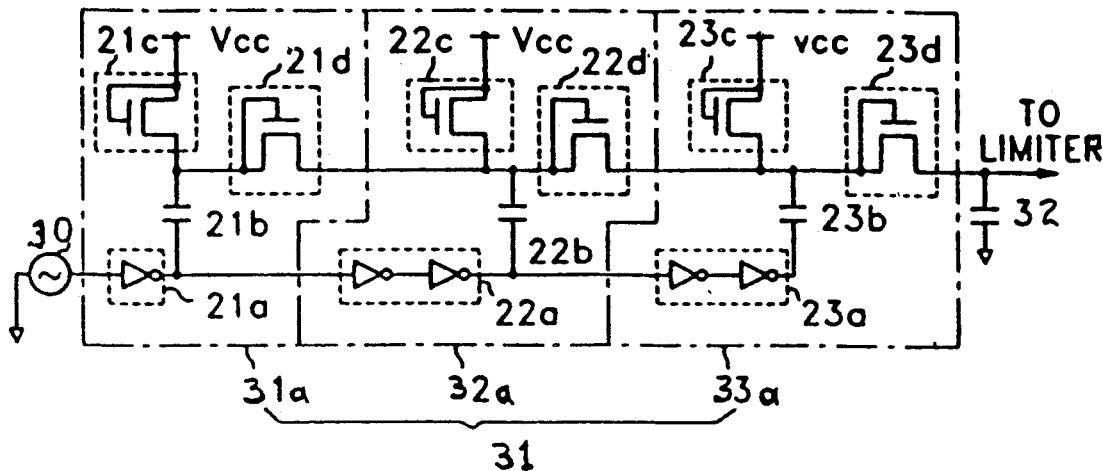

Referring to FIG. 5c, the charge pump 31 is composed of a three stage cascade connection, each stage of which includes amplifiers 21a–23a, pump capacitors 21b–23b, first pump diodes 21c–23c, and second pump diodes 21d–23d. The first stage 31a is connected such that the AC signal outputted from oscillator 30 is supplied to one end of the pump capacitor 21b using a CMOS inverter as the amplifier 21a. The other end of the pump capacitor 21b is supplied with charges from a power voltage supply line Vcc through the first pump diode 21c and the charge stored in the pump capacitor 21b is supplied to the pump capacitor 22b of the next stage through the second pump diode 21d. The connections of second stage 32a and third stage 33a are similar to that of first stage 31a, except that a CMOS buffer composed of two cascaded CMOS inverters as amplifiers 22a and 23a is employed in order to drive their respective pump capacitors by a delayed AC signal which is supplied from the preceding stage at predetermined time intervals. Therefore, when the AC signal at a low state is supplied to the pump capacitor of the preceding stage, the pump capacitor is charged from the power voltage supply line Vcc through the first pump diode. When the AC signal is at a high state, the charge stored in the pump capacitor is pumped to the supply voltage side of the next stage's pump capacitor through the second pump diode. In the next stage, since the amplifiers 21a-23a delay the AC signal from the preceding stage for a predetermined time to drive the pump capacitor, the charge pumped in the preceding stage and the charge stored in the pump capacitor thereof are pumped to the succeeding stage. As a result, the charge pumped in the last stage is the sum of the charge of every stage. The output of charge pump 20 is stored in the charge storage capacitor 32 having a larger capacity. Here, first and second pump diodes 21c-23c and 21d-23d are actually formed by MOS transistors serving as diodes. It should be noted that a common PN junction diode or any other unipolar current-conductive device may also be used. The above-described charge pump 31 is formed by cascading a plurality of stages together, so as to more quickly pump the desired charge.

Figure 5D:
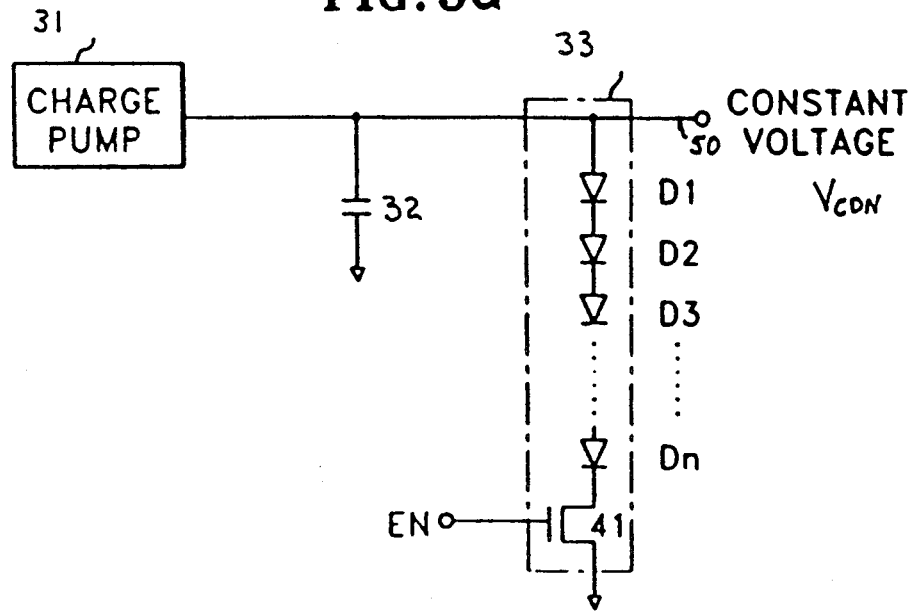

Referring to FIG. 5d, the voltage limiter 33 is formed by serial connection of a forward-biased plurality of diodes D1-Dn across charge capacitor 32, through MOS transistor 41 which is also turned on and off by the enable signal. Accordingly, the sum of the forward-biased voltage of the n diodes is output by a certain voltage at an output terminal 50, when enable signal EN is high. Therefore, a predetermined constant voltage can be obtained by specifying the number of connected diodes. The diodes may be MOS diodes or a zener diode.

In the present invention as described above, the charge storage capacitor is stored by pumping charges from the power source supply line by a pumping ratio in accordance with the AC signal frequency, then the voltage across the charge storage capacitor are limited and output at the desired voltage level. As a result, a constant voltage can be obtained independent of the power source voltage. Further, the obtained voltage can be greater than the power source voltage, which makes it suitable for the control circuitry of a VLSI system or a memory device.

Figure 6:
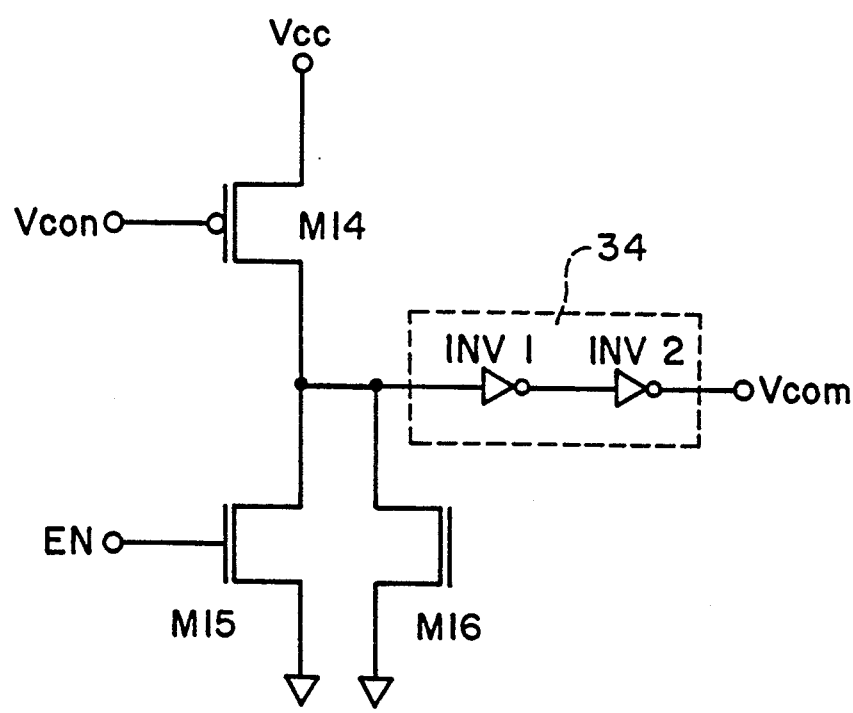
FIG. 6 is a circuit diagram of an embodiment of the comparator shown in FIG. 4.

Referring to FIG. 6, the embodiment of the comparator 21 of the present invention comprises a PMOS transistor M14 whose gate is supplied with a constant output voltage Vcon from the constant voltage generator 20 and whose source is supplied with a supply voltage Vcc, source grounded NMOS transistor M15 whose gate is supplied with an external enable signal EN and whose drain is connected to the drain of PMOS transistor M14, a CMOS buffer 34 composed of two inverters INV1 and INV2 for buffering the common drain voltage of the two transistors M14 and M15 and supplying output Vcom, and a source grounded NMOS transistor M16 whose gate is connected to a common connecting point between inverters INV1 and INV2 and whose drain is connected to the common drain of transistors M14 and M15. Accordingly, if Vcc is greater than Vcon plus VTP, PMOS transistor M14 is turned on, making the output Vcom go high. Conversely, if Vcc is smaller than Vcon plus VTP, PMOS transistor M14 is turned off, making the output Vcom go low. When the comparator's output is not desired, the external enable signal EN can be set low, thereby preventing power consumption, and NMOS transistor M16 latches the output Vcom to a low logic.

Figure 7:
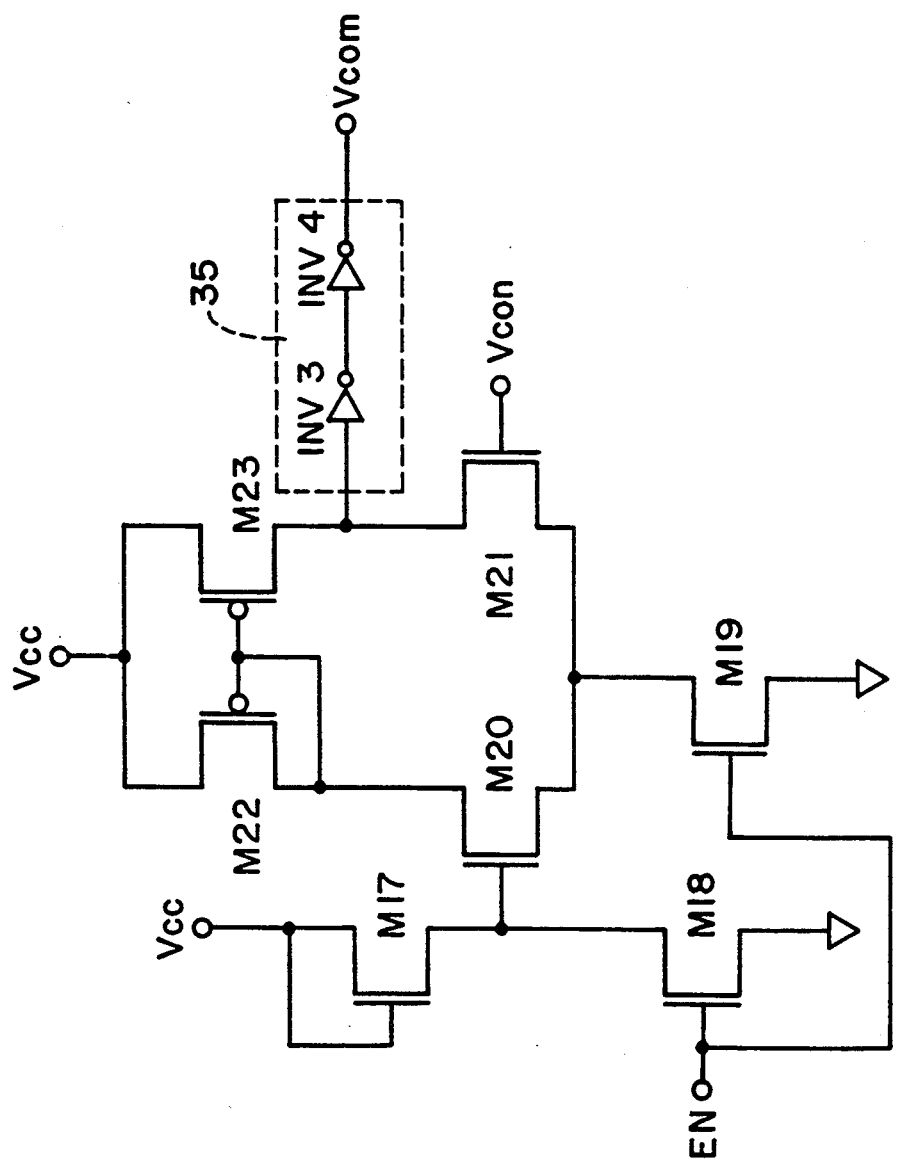
FIG. 7 is a circuit diagram of another embodiment of the comparator shown in FIG. 4.

Referring to FIG. 7, another embodiment of the comparator of the present invention consists of NMOS transistors M17 and M18 for generating a comparing voltage of $Vcc-V_T$ in response to an external enable signal EN, an NMOS differential amplifier composed of NMOS transistors M19, M20 and M21, and PMOS transistors M22 and M23 for comparing the comparing voltage with the constant voltage Vcon of the constant voltage generator in response to the external enable signal EN, and a CMOS buffer 35 composed of two inverters INV3 and INV4 for buffering the output of the MOS differential amplifier and then supplying output Vcom. Thus, the output Vcom of the comparator becomes a high logic state if Vcc- VTN is greater than Vcon, and low if Vcc - VTN is less than Vcon.

As described above, according to the present invention, when data is driven to be a high level, the boosted voltage level is varied according to the variation in supply voltage, thereby improving the operating speed and logic high data outputs.

Also, noise due to overdriving can be reduced by preventing excessive bootstrapping performed at high Vcc levels. And, the derivative di/dt at the falling edge of output can be reduced by slowly causing the turn-on operation of the pull-down transistor. This can prevent the generation of noise due to undershoot.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A data output buffer comprising:
    an output driving stage having a pair of pull-up transistors connected in parallel to each other and a pull-down transistor connected serially with said pair of pull-up transistors;
    a latch circuit for latching a pair of complementary signals;
    first gate means for gating an inverted output signal of said latch circuit in response to an external output enable signal;
    a first inverter for inverting the output of said first gate means and supplying the inverted output to the gate of said pull-down transistor of said output driving stage;
    second gate means for gating a non-inverted output signal of said latch circuit in response to said external output enable signal and supplying the gated non-inverted outuput signal to a second inverter, said second inverter being operatively coupled to drive the gate of a first transistor of said pull-up transistor pair;

third gate means for gating said non-inverted output signal of said latch circuit in response to said external output enable signal; and selective bootstrap circuit means, responsive to an external supply voltage, the gated non-inverted output signal from said second gate means, and an output from said third gate means, for driving the gate of the other transistor of said pullup transistor pair to a voltage level of said external supply voltage when the external supply voltage is higher than a predetermined voltage level, and to a boosted voltage level when the external supply voltage is lower than the predetermined voltage level.

2. A data output buffer as claimed in claim 1, wherein said selective bootstrap circuit means comprises:

a constant voltage generator for generating a predetermined constant voltage;

a comparator for comparing the constant voltage supplied from said constant voltage generator with the external supply voltage;

a selective bootstrap load for selectively generating the external supply voltage level for the boosted voltage level in response to an output signal from said comparator and the output from said third gate means; and a drive transistor coupled between said selective bootstrap load and the gate of said other transistor of said pull-up transistor pair for generating an appropriate drives signal thereto in response to an output signal from said second gate means.

3. A data output buffer as claimed in claim 2, wherein said selective bootstrap load comprises:

a load transistor connected to said drive transistor;

a first capacitor connected between the gate of said load transistor and the output of said third gate;

a biasing transistor for precharging said first capacitor;

combinatorial logic gate means for combining the outputs of said second gate means and said comparator, to select bootstrapping;

a second capacitor connected between the output terminal of said combinatorial logic gate means and the source of said load transistor; and a switching transistor connected between said load transistor and said drive transistor, and switched in response to the output signal of said second gate means.

4. A data output buffer as claimed in claim 2, wherein said comparator comprises:

a PMOS transistor whose gate is supplied with a constant output voltage from said constant voltage generator, and whose source is supplied with an external supply voltage;

a source grounded NMOS transistor whose gate is supplied with an external enable signal, and whose drain is connected to the drain of said PMOS transistor;

a CMOS buffer composed of two inverters for buffering the common drain voltage of said two transistors, and supplying the output of said comparator; and a source grounded NMOS transistor whose gate is connected to the common connecting point between said inverters, and whose drain is connected to said drain of said PMOS transistor.

5. A data output buffer as claimed in claim 2, wherein said comparator comprises:

means for generating a first comparing signal obtained by subtracting a threshold voltage VTN of an NMOS transistor from an external supply voltage by an external enable signal;

a MOS differential amplifier for comparing said first comparing signal with said predetermined constant voltage from said constant voltage generator in response to an external enable signal; and a CMOS buffer composed of two inverters for buffering the output of said MOS differential amplifier, and supplying the output of said comparator.

6. A data output buffer as claimed in claim 2, wherein said constant voltage generator comprises:

an oscillator for generating an alternating current signal;

a charge pump for pumping electric charges from a first power source line at a predetermined pump rate in response to the alternating current signal;

a charging capacitor for storing electric charges pumped by the charge pump; and a voltage limiter for limiting the voltage across the capacitor to a predetermined level and outputting a constant voltage.

7. A data output buffer as claimed in claim 1, wherein said first inverter is composed of a CMOS inverter circuit having a pull-up load.

* * * * *